(12) United States Patent
Lee et al.

(10) Patent No.: US 8,492,643 B2
(45) Date of Patent: Jul. 23, 2013

(54) THERMOELECTRIC MATERIAL, AND THERMOELECTRIC ELEMENT AND THERMOELECTRIC MODULE COMPRISING SAME

(75) Inventors: Sang-mock Lee, Yongin-si (KR);
Yong-seung Kwon, Suwon-si (KR);
Jong-soo Rhyee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 601 days.

(21) Appl. No.: 12/707,235

(22) Filed: Feb. 17, 2010

(65) Prior Publication Data

US 2010/0206349 A1    Aug. 19, 2010

(30) Foreign Application Priority Data

Feb. 18, 2009  (KR) .................. 10-2009-0013505

(51) Int. Cl.
*H01L 35/14* (2006.01)
(52) U.S. Cl.
USPC .................. 136/236.1; 136/239
(58) Field of Classification Search
USPC ................. 136/200–242
See application file for complete search history.

(56) References Cited

U.S. PATENT DOCUMENTS 3,073,882 A * 1/1963 Merriam et al. ......... 252/62.3 T
3,635,037 A * 1/1972 Hubert ..................... 62/3.2
2007/0034838 A1 * 2/2007 Imaoka et al. ............. 252/500
2008/0295879 A1 * 12/2008 Atanackovic ............... 136/238
2011/0056531 A1 * 3/2011 Meisner et al. ............ 136/201

FOREIGN PATENT DOCUMENTS

| JP | 2006-310361 | 11/2006 |
| JP | 2007-012980 | 1/2007 |
| KR | 100728178 | 6/2007 |
| KR | 10-2007-0117270 | 12/2007 |

OTHER PUBLICATIONS

Kappler et al. ("Low-temperature properties of the Ce(Pd 1-x Nix)3 system"). Eur. Phys. J. B 37, 163-167 (2004).*
K.J. Proctor et al., "Modification of the thermoelectric properties of CePd3 by the substitution of neodymium and thorium," Journal of Physics and Chemistry of Solids, vol. 60, 1999, pp. 663-671.
St. Laumann et al., "Crystal electric field effects in Ce1-xLaxPt3Si", Physica B, vol. 378-380, 2006, p. 386-387.

* cited by examiner

*Primary Examiner* — Jonathan Johnson
*Assistant Examiner* — Christina Chern
(74) *Attorney, Agent, or Firm* — Cantor Colburn LLP

(57) ABSTRACT

A thermoelectric material, and a thermoelectric element and a thermoelectric module including the thermoelectric material are disclosed. The thermoelectric material may have improved thermoelectric properties by irradiating the thermoelectric material with accelerated particles such as protons, neutrons, or ion beams. Thus, the thermoelectric material having excellent thermoelectric properties may be efficiently applied to various thermoelectric elements and thermoelectric modules.

11 Claims, 11 Drawing Sheets

THERMOELECTRIC MATERIAL, AND THERMOELECTRIC ELEMENT AND THERMOELECTRIC MODULE COMPRISING SAME

CROSS-REFERENCE TO RELATED APPLICATIONS

This application claims the priority to Korean Patent Application No. 10-2009-0013505, filed on Feb. 18, 2009, and all the benefits accruing therefrom under 35 U.S.C. 119, the content of which in its entirety is herein incorporated by reference.

BACKGROUND

1. Field

One or more embodiments relate to a thermoelectric material, and a thermoelectric element and a thermoelectric module including the thermoelectric material, and more particularly, to a thermoelectric material having excellent thermoelectric properties by irradiating the thermoelectric material with energetic particles such as protons, neutrons, or ion beams, and a thermoelectric element and a thermoelectric module including the thermoelectric material.

2. Description of the Related Art

In general, thermoelectric materials are used in active cooling, waste heat power generation, and like applications by taking advantage of the Peltier effect and the Seebeck effect. FIG. 1 schematically illustrates thermoelectric cooling using the Peltier effect in which a voltage is applied through electrical contacts 111, 112 across a structure of p-type thermoelectric material 121 and a structure of n-type thermoelectric material 122 arrayed parallel to one another and connected by a conductor 130. As illustrated in FIG. 1, the Peltier effect is demonstrated when the external DC voltage is applied across the p- and n-type thermoelectric materials 121 and 122, respectively, holes generated in the p-type material and electrons generated in the n-type material are transported (i.e., flow) in the same direction toward the heat generating end (small arrows) away from a region of heat absorption, and toward a region of heat generation located at opposite ends of both the p-type and n-type materials structures. FIG. 2 schematically illustrates thermoelectric power generation by the Seebeck effect. Referring to FIG. 2, the Seebeck effect is demonstrated when heat supplied from an external heat source 230 to a p-type thermoelectric material 221 and an n-type material 222, induces a flow of current generated in the p-type thermoelectric material 221 (holes) and the n-type thermoelectric material 222 (electrons) where the electrons and holes are transported away from the heat source 230 through the thermoelectric materials 221 and 222 and through electrical contacts 211 and 212, thereby generating power (current flow shown by arrow (I)).

Active cooling that employs a device fabricated from a thermoelectric material improves the thermal stability of devices, does not cause vibration and noise as would accompany, for example, a heat sink and fan combination, and does not use a separate condenser and refrigerant, and thus the volume of devices is small and the active cooling method is environmentally-friendly. Thus, the active cooling by a device that uses such a thermoelectric material may be applied to refrigerant-free refrigerators, air conditioners, a variety of micro-cooling systems, and the like. In particular, when a thermoelectric device is attached to, for example, a memory device, the temperature of the memory devices may be reduced and maintained at a uniform and stable temperature, in comparison with a conventional cooling method which has greater variation in temperature across the cooling apparatus. Thus, the performance of, for example, memory devices may be improved.

Meanwhile, when thermoelectric materials are used for thermoelectric power generation by using the Seebeck effect, the waste heat extracted thereby may be used as an energy source. Thus, thermoelectric materials may be applied in a variety of fields that increase energy efficiency or reuse waste heat, such as in vehicle engines and air exhausts, waste incinerators, waste heat from smelters such as in iron mills, power sources for medical devices for the human body which use human body heat, and the like.

As a factor determining the performance of such thermoelectric materials, a dimensionless figure-of-merit ZT defined in Equation 1 below is used.

$$ZT = \frac{S^2 \sigma T}{k} \quad \text{Equation 1}$$

In Equation 1, S is a Seebeck coefficient, σ is electrical conductivity, T is absolute temperature, and κ is thermal conductivity.

SUMMARY

One or more embodiments include a thermoelectric material having excellent thermoelectric properties due to the increase in a Seebeck coefficient.

One or more embodiments include a thermoelectric element including the thermoelectric material.

One or more embodiments include a thermoelectric module including the thermoelectric element.

Additional aspects will be set forth in part in the description which follows and, in part, will be apparent from the description, or may be learned by practice of the presented embodiments.

To achieve the above and/or other aspects, one or more embodiments may include a thermoelectric material represented by Formula 1 below and having a figure-of-merit ZT, as defined in Equation 1 below, of about 0.3 to about 1.2 measured at about 300K:

$$CePd_{3-x}A_x \quad \text{Formula 1}$$

wherein A is transition metal other than Pd, and $$0 \leq x \leq 0.8;$$

$$ZT = \frac{S^2 \sigma T}{k} \quad \text{Equation 1}$$

wherein ZT is the figure-of-merit, S is a Seebeck coefficient in units of microvolts per degree Kelvin for the thermoelectric material, σ is electrical conductivity in units of inverse ohms-meter, T is absolute temperature in degrees Kelvin, and κ is thermal conductivity in Watts per degree Kelvin-meters.

In another embodiment, a method of preparing the thermoelectric material includes synthesizing a thermoelectric composition represented by Formula 1 and irradiating the thermoelectric composition with accelerated energetic particles.

In another embodiment, a thermoelectric element comprising the thermoelectric material.

In another embodiment, a thermoelectric module includes an upper insulating substrate comprising at least one patterned upper electrode on a surface of the upper insulating substrate; and a lower insulating substrate comprising at least one patterned lower electrode on a surface of the lower insulating substrate, wherein a p-type thermoelectric element and an n-type thermoelectric element are each in serial contact with the at least one upper electrode and the at least one lower electrode, wherein the p-type thermoelectric element or the n-type thermoelectric element are the thermoelectric elements including the thermoelectric material.

To achieve the above and/or other aspects, one or more embodiments may include a thermoelectric element including the thermoelectric material.

To achieve the above and/or other aspects, one or more embodiments may include a thermoelectric module including the thermoelectric material.

BRIEF DESCRIPTION OF THE DRAWINGS

These and/or other embodiments will become apparent and more readily appreciated from the following description, taken in conjunction with the accompanying drawings of which.

DETAILED DESCRIPTION

Figure 1:
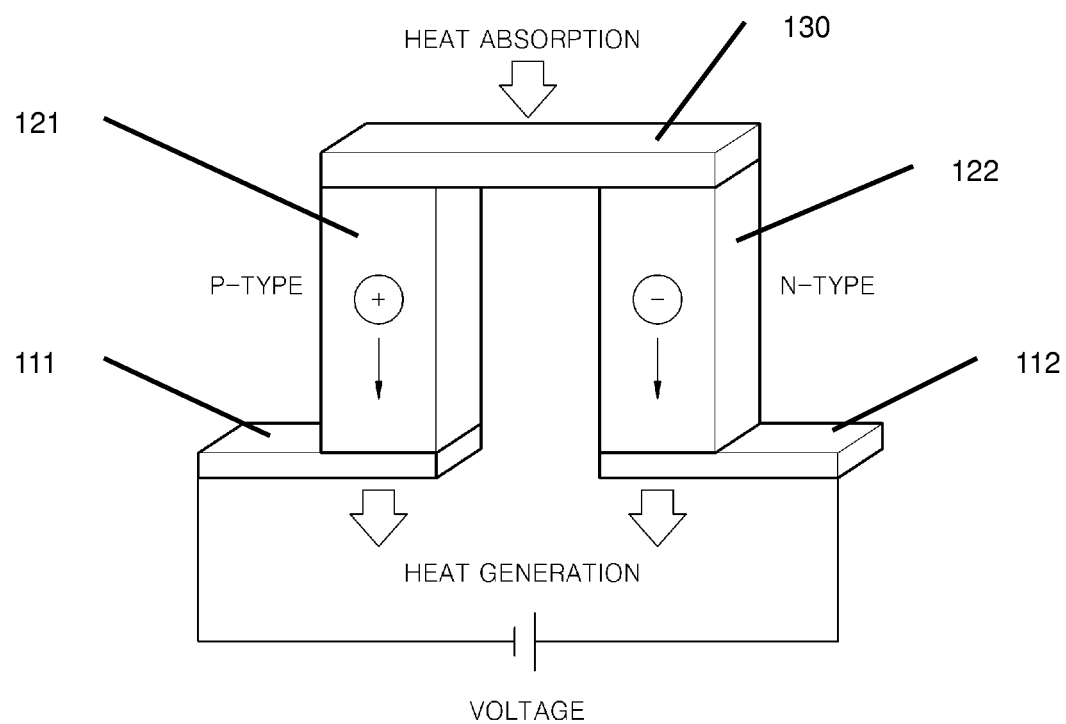
FIG. 1 schematically illustrates thermoelectric cooling using the Peltier effect.
Figure 2:
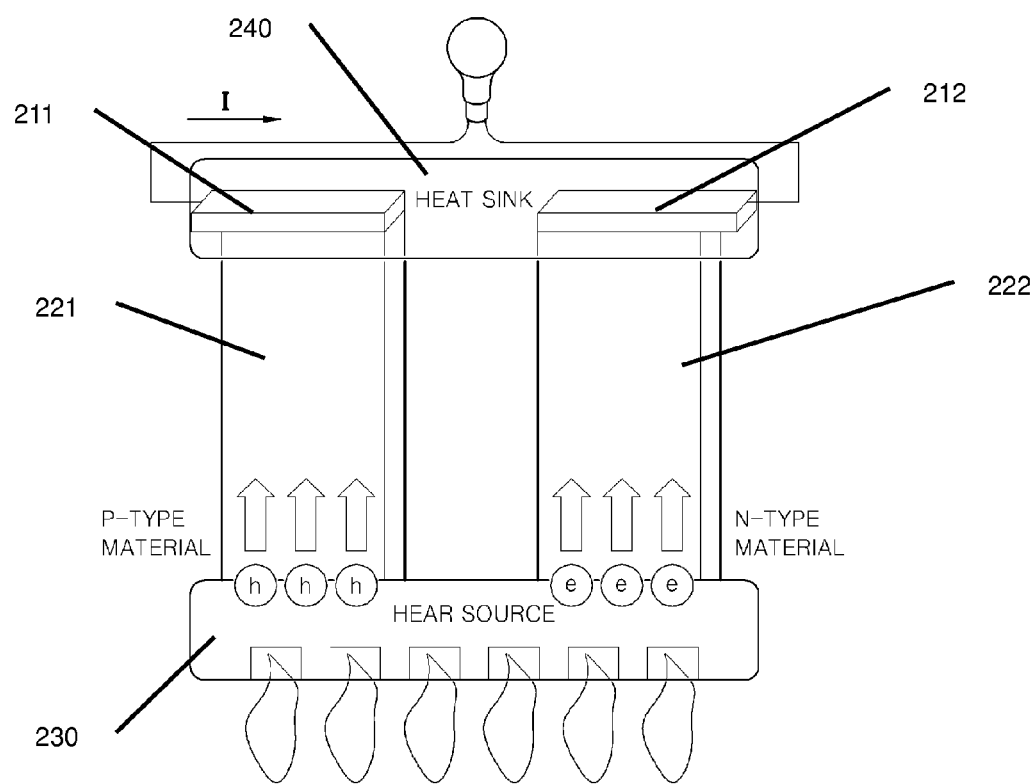
FIG. 2 schematically illustrates thermoelectric power generation by the Seebeck effect.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, regions, integers, steps, operations, elements, and/or components, but do not preclude the presence or addition of one or more other features, regions, integers, steps, operations, elements, components, and/or groups thereof. All ranges and endpoints reciting the same feature are independently combinable.

It will be understood that when an element is referred to as being "on" another element, it can be directly on the other element or one or more intervening elements may be present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

A thermoelectric material according to an embodiment is represented by Formula 1 below and has a figure-of-merit, defined as Equation 1 below, of about 0.3 to about 1.2, at a temperature of about 300 K:

$$CePd_{3-x}A_x \qquad \text{Formula 1}$$

wherein A is transition metal except for Pd, and $0 \leqq x \leqq 0.8$.

$$ZT = \frac{S^2 \sigma T}{k} \qquad \text{Equation 1}$$

wherein for the thermoelectric material, ZT is a figure-of-merit, S is the Seebeck coefficient for the thermoelectric material (expressed in units of microvolts per Kelvin, $\mu V/K$), $\sigma$ is electrical conductivity for the thermoelectric material (expressed in units of inverse ohms-meter, $(\mu \Omega \text{-m})^{-1}$), T is absolute temperature (expressed in units of degrees Kelvin; typically this value is about 300 K), and $\kappa$ is thermal conductivity in units of Watts per meter-degree Kelvin, $W \cdot m^{-1} \cdot K^{-1}$).

The thermoelectric material represented by Formula 1 is a Kondo gap thermoelectric material based on a rare earth element (e.g., cerium). For example, a compound of Formula 1 where x is 0, $CePd_3$, has a figure-of-merit of 0.2 at about 300K.

Physical properties of the thermoelectric material of Formula 1 may be modified by irradiating the thermoelectric material with energetic particles. For example, thermoelectric properties of the thermoelectric material may be improved by irradiating the thermoelectric material with protons, neutrons, or ion beams, or any combination of these. Exemplary methods of irradiation include, but are not limited to, ion beam, e-beam, plasmas including inductively coupled plasmas, synchrotron radiation, radioactive decay particles, ion implantation, proton irradiation, and the like.

It has been found that by irradiating the thermoelectric material represented by Formula 1 with the energetic particles, the Seebeck coefficient in Equation 1 increases and thus thermoelectric properties of the thermoelectric material may be improved. For example, when a thermoelectric material of Formula 1 having a ZT of about 0.2 at about 300K is irradiated with protons, neutrons, or ion beams, the Seebeck coefficient may be greater than or equal to 100 $\mu V/K$, for example, from about 120 to about 200 $\mu V/K$ at about 300K. Thus, the ZT of the thermoelectric material of Formula 1 may be in the range of about 0.3 to about 1.2, for example, from about 0.35 to about 0.8, at about 300K due to the irradiation with the energetic particles.

In Formula 1, A is an element doping Pd. For cost reasons Pd may be substituted with an inexpensive element, thereby increasing product and process economy. In this regard, A may be any element that may form an f-d hybridized band between Ce and Pd. In an embodiment, A may be a transition metal other than Pd, and in a specific embodiment, may be at least one selected from the group consisting of Mn, Fe, Co, Ni, Cu, Zn, and any mixture thereof. A magnetic element may be used, wherein an element having magnetism may be Fe, Co, Ni, or any mixture thereof.

If Pd is doped with A, the amount of doped A may be equal to or less than a mole fraction of 0.8 (i.e., where x is 0.8 in Formula 1), and specifically from about 0.1 to about 0.5 moles. In an embodiment, in Formula 1 where x is 0 (i.e., where no dopant is included), the thermoelectric compound is irradiated such that the ZT of the thermoelectric material is greater than or equal to 0.3. In another embodiment, in Formula 1, $0 \leq x \leq 0.8$, specifically $0.1 \leq x \leq 0.8$, and more specifically $0.1 \leq x \leq 0.5$, and the ZT of the thermoelectric material is greater than or equal to 0.3. In a specific embodiment, where x is greater than 0, the thermoelectric material is irradiated.

Thus, the thermoelectric material of Formula 1, which has excellent thermoelectric properties, may be prepared by synthesizing a thermoelectric composition represented by Formula 1 below, and irradiating the thermoelectric composition with energetic particles.

The thermoelectric composition of Formula 1 may be synthesized using the methods below, but the method is not limited thereto.

1. Polycrystalline Synthesis (1) Method using an ampoule: One method includes adding a material element to an ampoule made of a heat resistant material such as a quartz or metal tube, sealing the ampoule under vacuum, and heat treating the ampoule.

(2) Arc melting method: another method includes adding a material element to a inertable chamber, and melting the material element by arc discharge under an inert gas atmosphere (e.g., helium, argon, or the like), to thereby prepare the thermoelectric composition.

(3) Solid state reaction method: another method includes mixing raw material powders to process the mixed powder to form a solid, and then heat treating the resultant solid under inert gas atmosphere in, for example, a furnace, or heat treating the mixed raw material powders (for example, in a furnace under inert gas atmosphere) and then processing and sintering the resultant to form the thermoelectric compound.

2. Single Crystal Growth (1) Metal flux method: one method includes adding, to a furnace, a material element and an element that provides a flux, so that the material element satisfactorily grows and forms a crystal at a lower temperature than the melting point of the resulting crystal.

(2) Bridgeman method: another method includes adding a material element to a furnace with either multiple heating zones or which can progressively pass the material through a heating zone, such as in a zone or tube furnace, heating the material element at an end zone of the furnace at a high temperature until the material element is melted, and progressively and slowly locally melting the material element in successive adjacent regions so as to pass the whole material element through the heated region(s), thereby forming a crystal upon cooling of the heated region(s).

(3) Optical floating zone method: another method includes preparing a material element in the form of a seed rod and a feed rod, converging light of a high intensity lamp on the feed rod to irradiate and locally melt the material element at a high temperature, and then slowly and progressively moving the region to be irradiated into the illumination path of the lamp to progressively melt the material element to grow a crystal.

(4) Vapor transport method: another method includes adding a material element to a bottom portion of a quartz tube, where the quartz tube is under vacuum, heating the bottom portion containing the material element, and maintaining a top portion of the quartz tube at a low temperature to induce a solid state reaction at a low temperature while the material element is evaporated, thereby forming the thermoelectric compound and growing a crystal.

The thermoelectric properties of the thermoelectric material represented by Formula 1 may be improved by irradiating the thermoelectric material with various accelerated particles, where the accelerated particles may be protons, neutrons, ion beams, or any combination thereof.

The conditions for irradiating the thermoelectric compound may vary according to the thickness of the thermoelectric compound. The thermoelectric compound may be irradiated with the accelerated energetic particles such that the acceleration energy of the accelerated energetic particles is from about 10 to about 50 MeV, specifically about 20 to about 40 MeV, and the dose of the accelerated energetic particles is from about $1.0 \times 10^{14}$ per $cm^2$ to about $1.0 \times 10^{16}$ per $cm^2$, specifically about $1.0 \times 10^{15}$ per $cm^2$ to about $1.0 \times 10^{16}$ per $cm^2$. If the acceleration energy of the accelerated particles is greater than about 50 MeV, use of such high radiation would require significant precautions to prevent any radiation leak and therefore would prove impractical to carry out irradiation at such doses for safety reasons. If the acceleration energy of the accelerated particles is less than about 10 MeV however, sufficient thermoelectric properties in the thermoelectric material may not be obtained. If the concentration of the accelerated particles is greater than $1.0 \times 10^{16}$ per $cm^2$, any thermoelectric material so irradiated may be contaminated by excessively high levels of radioactivity. If the dose of the accelerated particles is less than $1.0 \times 10^{14}$ per $cm^2$, sufficient thermoelectric properties in the thermoelectric material may not be obtained.

The thermoelectric composition so irradiated with the accelerated energetic particles (to provide the thermoelectric material) may have a thickness suitable for the irradiation, for example, a thickness of from about 1 to about 5 mm, or from about 2 to about 3 mm.

Since the Seebeck coefficient of the thermoelectric material of Formula 1 increases by irradiating the thermoelectric composition with the accelerated energetic particles, excellent and desirably improved thermoelectric properties may be obtained for the thermoelectric material.

According to another embodiment, a thermoelectric element is prepared by cutting or shaping, and processing the thermoelectric material.

The thermoelectric element may be a p-type thermoelectric element or an n-type thermoelectric element. The thermoelectric element may have a specific shape, such as for example a rectangular parallelepiped, using the thermoelectric material.

Meanwhile, the thermoelectric element may further be an element combined with electrodes to exhibit cooling effects by current supply or may be an element exhibiting power generation by a temperature difference.

Figure 3:
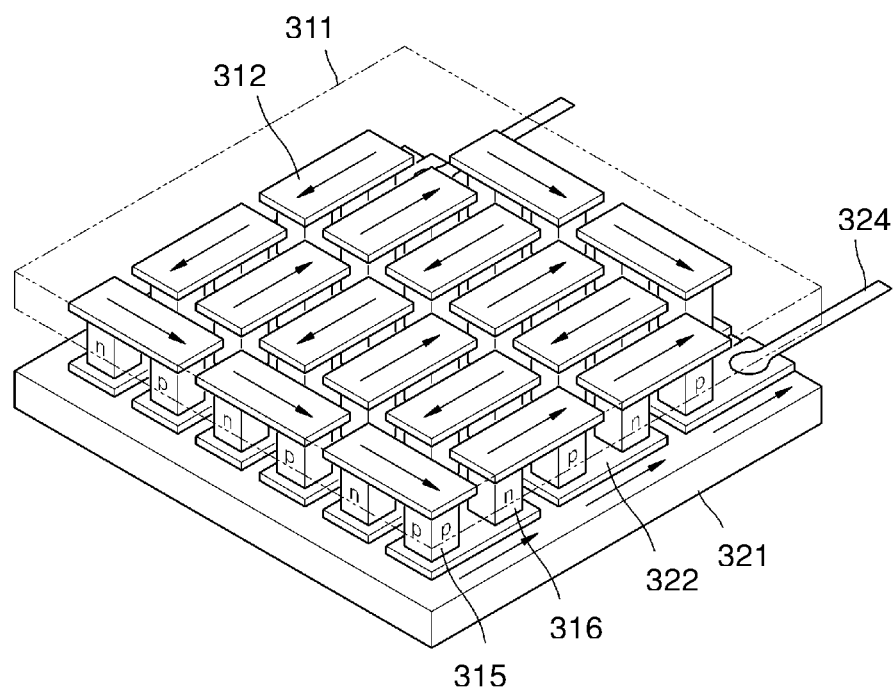
FIG. 3 schematically illustrates an exemplary thermoelectric module including a thermoelectric element, according to an embodiment.
Figure 4:
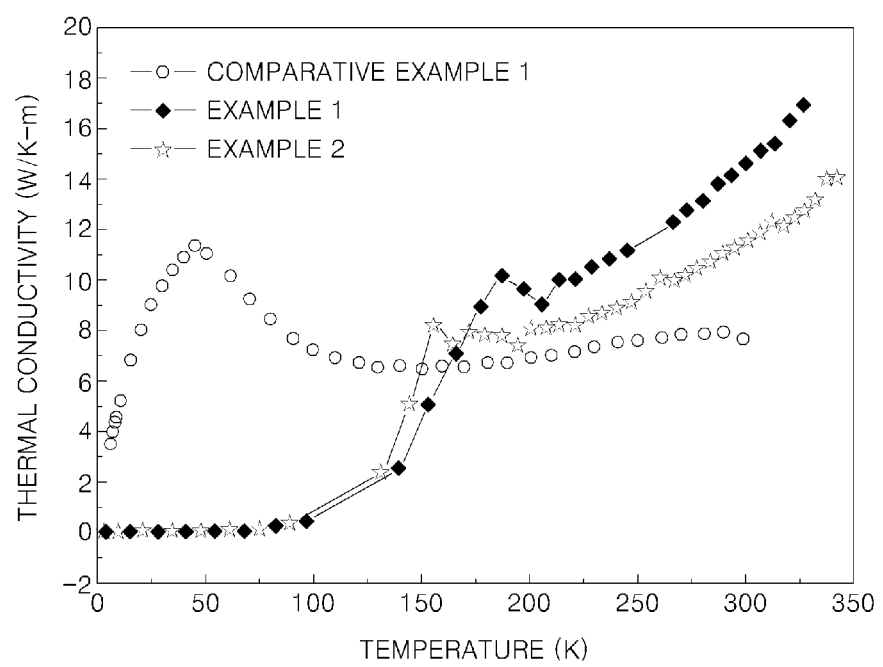
FIG. 4 is a graph illustrating thermal conductivities of exemplary thermoelectric materials prepared according to Examples 1 and 2 and Comparative Example 1.
Figure 5:
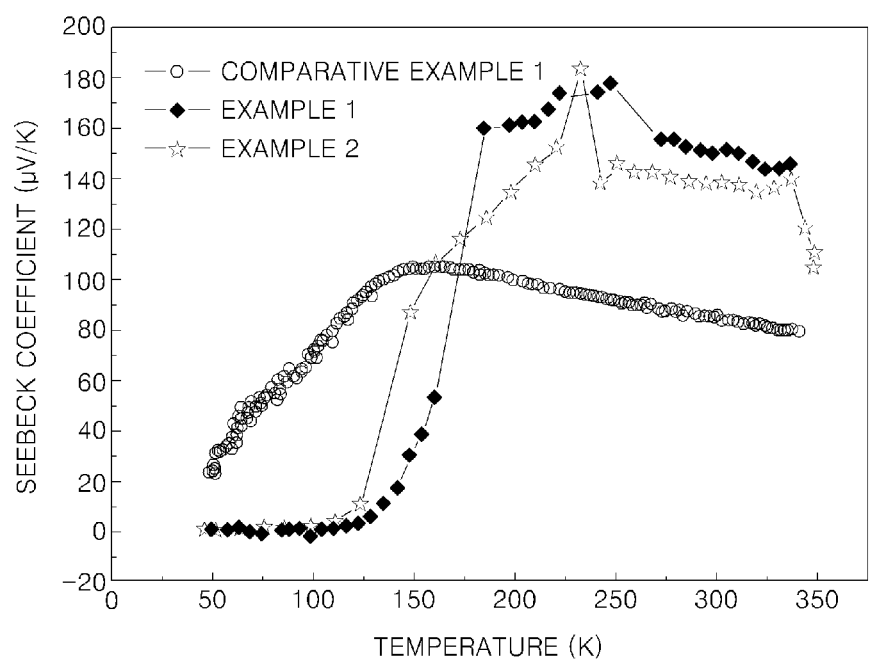
FIG. 5 is a graph illustrating Seebeck coefficients of exemplary thermoelectric materials prepared according to Examples 1 and 2 and Comparative Example 1.
Figure 6:
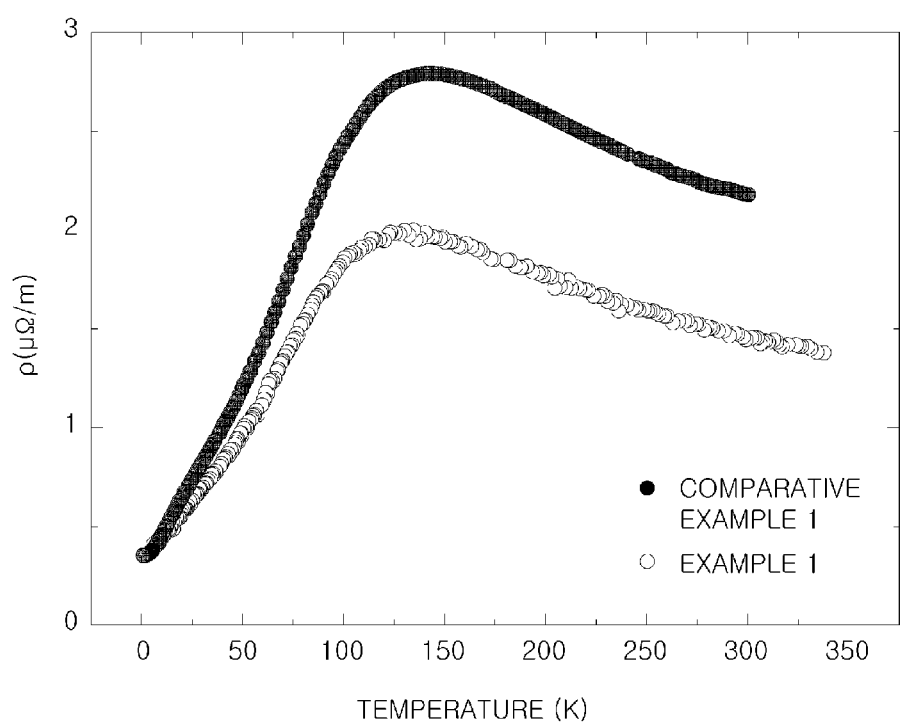
FIG. 6 is a graph illustrating electrical resistances of exemplary thermoelectric materials prepared according to Example 1 and Comparative Example 1.
Figure 7:
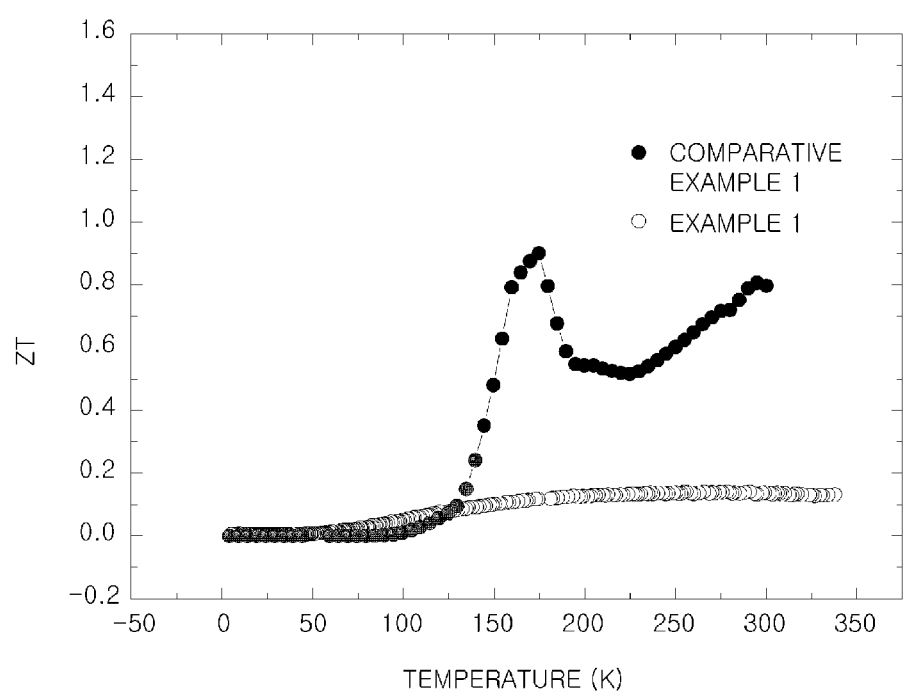
FIG. 7 is a graph illustrating figure-of-merits ZT of exemplary thermoelectric materials prepared according to Example 1 and Comparative Example 1.
Figure 8:
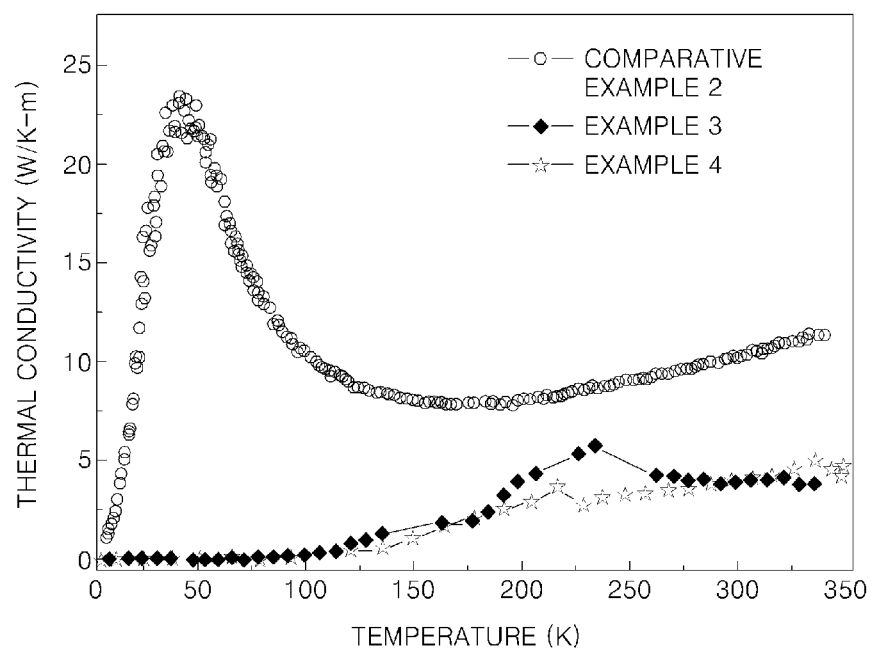
FIG. 8 is a graph illustrating thermal conductivities of exemplary thermoelectric materials prepared according to Examples 3 and 4 and Comparative Example 2.
Figure 9:
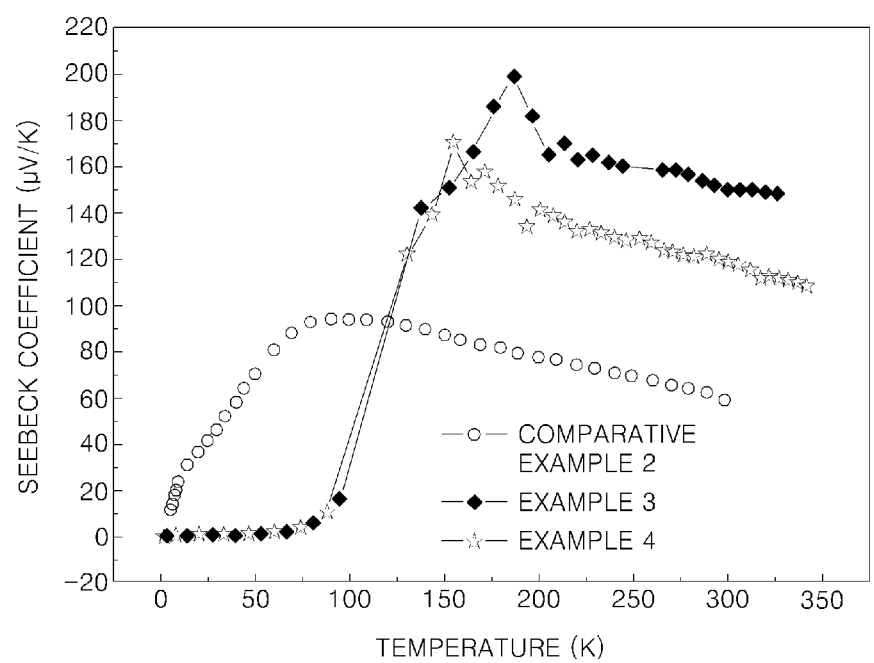
FIG. 9 is a graph illustrating Seebeck coefficients of exemplary thermoelectric materials prepared according to Examples 3 and 4 and Comparative Example 2.
Figure 10:
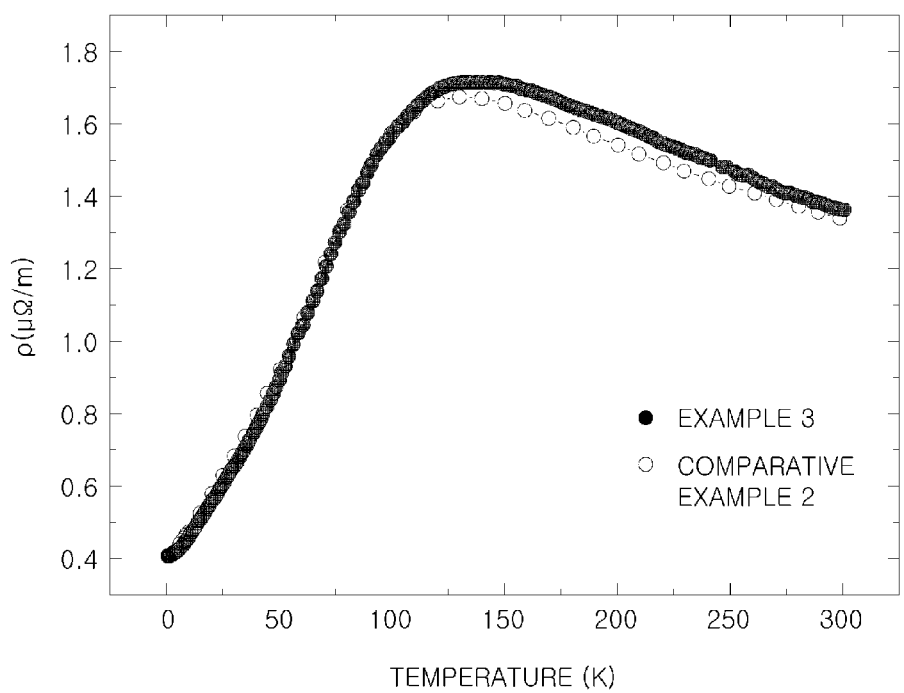
FIG. 10 is a graph illustrating electrical resistances of exemplary thermoelectric materials prepared according to Examples 3 and 4 and Comparative Example 2.
Figure 11:
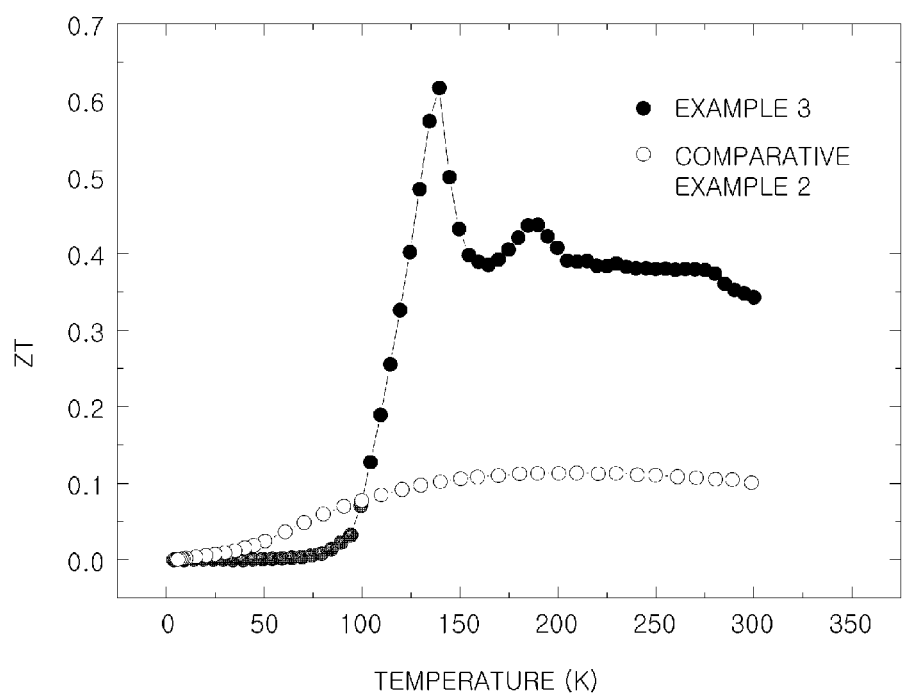
FIG. 11 is a graph illustrating figure-of-merits ZT of exemplary thermoelectric materials prepared according to Example 3 and Comparative Example 2.

FIG. 3 schematically illustrates a thermoelectric module including at least one p-type thermoelectric element 315 and an n-type thermoelectric element 16, according to an embodiment. In another embodiment, also in FIG. 3, an arrayed structure including more than one p-type thermoelectric element 315 and more than one n-type thermoelectric element 16 is provided. As shown in FIG. 3, a patterned upper electrode 312 (hereinafter referred to as 'upper electrode 312') is formed on a surface of an upper insulating substrate 311 (shown in transparent outline for clarity in FIG. 3) and a patterned lower electrode 322 (hereinafter referred to as 'lower electrode 322') is formed on a lower insulating substrate 21. The p-type thermoelectric element 315 and the n-type thermoelectric element 16 are each in serial contact with the upper electrode 312 and with the lower electrode 322. The upper and lower electrodes 312 and 322 are connectable to an external element via lead electrodes 24. As used herein, "serial contact" means the p- and n-type thermoelectric elements are electrically connected in series rather than in parallel circuit design.

The upper and lower insulating substrates 311 and 21 may be formed of gallium arsenide (GaAs), sapphire, silicon, pyrex, quartz glass, or the like. The upper and lower electrodes 312 and 322 may be formed of a conductive metal such as aluminum, nickel, gold, titanium, or the like. The size of the upper and lower electrodes is not limited. The upper and lower electrodes 312 and 322 may be patterned using a known method, such as for example, a lift-off process for semiconductor fabrication, a deposition process, and a photolithography process.

The thermoelectric module may be a thermoelectric cooling system or a thermoelectric power generation system. The thermoelectric cooling system may be a micro-cooling system, a universal cooling device, an air conditioner, and a waste heat recovery system, but is not limited thereto. The configuration of the thermoelectric cooling system and a method of preparing the thermoelectric cooling system are well known in the art and to the skilled artisan, and thus need not be further described herein.

Hereinafter, the present invention will be described more specifically with reference to the following examples, which are for illustrative purposes only and are not intended to limit the scope of the invention.

Example 1

Amounts of Ce and Pd are quantified to meet a molar ratio of 1:3 (respectively) and added to an arc-melting chamber, and arc melting under vacuum was performed five times for mixing the elements uniformly. The resulting metal material is cut into pieces each having a thickness of 2 mm and a size of 1 cm×0.3 cm, and added to a proton accelerator (MC-50, SCANTRONIX). Then, the metal material are then irradiated with protons at an acceleration energy of 30 MeV and a dose of $5.0 \times 10^{15}/cm^2$ to prepare a thermoelectric material.

Example 2

A thermoelectric material is prepared in the same manner as in Example 1, except that the dose of protons is $1.0 \times 10^{16}/cm^2$.

Example 3

Amounts of Ce, Pd, and Ni are quantified to meet a molar ratio of 1:2.7:0.3 respectively, and added to an arc-melting chamber, and arc melting is performed six times under vacuum for mixing the elements uniformly. The resulting metal material is cut into pieces each having a thickness of 2 mm, and a size of 1 cm×0.4 cm, and added to a proton accelerator (MC-50, SCANTRONIX). Then, the metal material is irradiated with protons at an acceleration energy of 30 MeV and a dose of $5.0 \times 10^{15}$ per $cm^2$ to prepare a thermoelectric material.

Example 4

A thermoelectric material is prepared in the same manner as in Example 3, except that the dose of protons is $1.0 \times 10^{16}$ per $cm^2$.

Comparative Example 1

A thermoelectric material is prepared in the same manner as in Example 1, except that the metal material is not irradiated with protons.

Comparative Example 2

A thermoelectric material is prepared in the same manner as in Example 3, except that the metal material is not irradiated with protons.

Experimental Example

Properties of the thermoelectric materials are shown in FIGS. 4 to 7. In particular, thermal conductivities ($\kappa$) (FIG. 4), Seebeck coefficients (S) (FIG. 5), electrical conductivities ($\sigma$) (FIG. 6), and figure-of-merits (ZT) (FIG. 7) of the thermoelectric materials prepared according to Examples 1 and 2 (see FIGS. 4 and 5) or Example 1 (FIGS. 6 and 7), and Comparative Example 1 were measured. In addition, thermal conductivities ($\kappa$), Seebeck coefficients (S), electrical conductivities ($\sigma$), and figure-of-merits (ZT) of the thermoelectric materials prepared according to Examples 3 and 4 (see FIGS. 8 and 9) or Example 3 (FIGS. 10 and 11), and Comparative Example 2 were measured, and are shown in FIGS. 8 to 11.

As shown in FIGS. 4 to 7, thermal conductivities of the thermoelectric materials prepared according to Examples 1 and 2 that were irradiated with protons are slightly greater than that of the thermoelectric material prepared according to Comparative Example 1 that is not irradiated with protons. As the Seebeck coefficients and electrical conductivities are increased, the figure-of-merits ZT significantly increases. The figure-of-merit ZT of the thermoelectric material prepared according to Example 1 is about 0.8 at about 300K.

As shown in FIGS. 8 to 11, thermal conductivities of the thermoelectric materials prepared according to Examples 3 or Examples 3 and 4, doped with Ni and irradiated with protons, are slightly greater than that of the thermoelectric material prepared according to Comparative Example 2 that is not irradiated with protons. As the Seebeck coefficients and electrical conductivities increases, the figure-of-merits ZT significantly increased. The figure-of-merit ZT of the thermoelectric material prepared according to Example 3 is about 0.35 at 300K.

As described above, according to the one or more of the above embodiments, a thermoelectric material having excellent thermoelectric properties is provided since the Seebeck coefficient increases. Thus, a thermoelectric element and a thermoelectric module including the thermoelectric material may be used in refrigerant-free refrigerators, air conditioners, waste heat power generation, thermoelectric nuclear power generation for the military and aerospace applications, microcooling systems, and the like.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A thermoelectric material represented by Formula 1 below and having a figure-of-merit ZT, as defined in Equation 1 below, of about 0.3 to about 1.2 measured at about 300K:

$$CePd_{3-x}A_x \qquad \text{Formula 1}$$

wherein A is a transition metal other than Pd, and $$0 \leq x \leq 0.8;$$

$$ZT = \frac{S^2 \sigma T}{k} \qquad \text{Equation 1}$$

wherein ZT is the figure-of-merit,
S is a Seebeck coefficient in units of microvolts per degree Kelvin for the thermoelectric material,
σ is electrical conductivity in units of inverse ohms-meter,
T is absolute temperature in degrees Kelvin, and
κ is thermal conductivity in Watts per degree Kelvin-meters,
wherein the composition is irradiated with accelerated particles comprising protons, neutrons, or an ion beam.

2. The thermoelectric material of claim 1, wherein the figure-of-merit ZT is about 0.35 to about 0.8 at a temperature of about 300 K.

3. The thermoelectric material of claim 1, wherein the Seebeck coefficient is equal to or greater than 100 microvolts per degree Kelvin.

4. The thermoelectric material of claim 1, wherein A is at least one selected from the group consisting of Mn, Fe, Co, Ni, Cu, Zn, and any mixture thereof.

5. The thermoelectric material of claim 1, wherein A is selected from the group consisting of Fe, Co, Ni, and any mixture thereof.

6. The thermoelectric material of claim 1, wherein for Formula 1, $0.1 \leq x \leq 0.5$.

7. A method of preparing the thermoelectric material of claim 1, the method comprising:
synthesizing a thermoelectric composition represented by Formula 1 below and irradiating the thermoelectric composition with accelerated energetic particles:

$$CePd_{3-x}A_x \qquad \text{Formula 1}$$

wherein A is transition metal other than Pd, and $$0 \leq x \leq 0.8, \text{ and}$$

wherein the composition is irradiated with accelerated particles comprising protons, neutrons or an ion beam.

8. The method of claim 7, wherein an acceleration energy of the accelerated energetic particles is from about 10 to about 50 MeV, and the dose of the accelerated particles is from about $1.0 \times 10^{14}$ per cm² to about $1.0 \times 10^{16}$ per cm².

9. The method of claim 7, wherein A is at least one selected from the group consisting of Mn, Fe, Co, Ni, Cu, Zn, and any mixture thereof.

10. A thermoelectric element comprising the thermoelectric material according to claim 1.

11. A thermoelectric module comprising:
an upper insulating substrate comprising at least one patterned upper electrode on a surface of the upper insulating substrate; and
a lower insulating substrate comprising at least one patterned lower electrode on a surface of the lower insulating substrate,
wherein a p-type thermoelectric element and an n-type thermoelectric element are each in serial contact with the at least one upper electrode and the at least one lower electrode,
wherein the p-type thermoelectric element or the n-type thermoelectric element are the thermoelectric element of claim 10.

* * * * *